(12) United States Patent  (10) Patent No.: US 8,588,338 B2
Wojtiuk  (45) Date of Patent: *Nov. 19, 2013

(54) DRIVER CIRCUIT FOR DRIVING A POWER AMPLIFIER

(71) Applicant: SiGe Semiconductor (Europe) Limited, Hertfordshire (GB)

(72) Inventor: Jeffrey Wojtiuk, Highbury (AU)

(73) Assignee: SiGe Semiconductor (Europe) Limited (GB)

( * ) Notice: Subject to any disclaimer, the term of this patent is extended or adjusted under 35 U.S.C. 154(b) by 0 days.

This patent is subject to a terminal disclaimer.

(21) Appl. No.: 13/733,380

(22) Filed: Jan. 3, 2013

(65) Prior Publication Data

US 2013/0121444 A1    May 16, 2013

Related U.S. Application Data

(63) Continuation of application No. 10/984,747, filed on Nov. 10, 2004, now Pat. No. 8,355,465.

(51) Int. Cl.
*H04L 27/20* (2006.01)
(52) U.S. Cl.
USPC ........... 375/308; 375/298; 375/261; 375/302; 375/376

(58) Field of Classification Search
USPC ......................................... 375/300
See application file for complete search history.

(56) References Cited

U.S. PATENT DOCUMENTS

| | | |
|---|---|---|
| 4,354,276 A | 10/1982 | Karabinis |
| 4,628,475 A | 12/1986 | Azusawa et al. |
| 6,008,703 A | 12/1999 | Perrott et al. |
| 6,415,002 B1 | 7/2002 | Edwards et al. |
| 6,501,234 B2 | 12/2002 | Lin et al. |
| 6,650,458 B1 | 11/2003 | Prosyk et al. |
| 6,674,811 B1 | 1/2004 | Desrosiers et al. |
| 6,693,929 B1 | 2/2004 | Essiambre et al. |
| 6,751,265 B1 | 6/2004 | Schell et al. |
| 7,006,562 B2 | 2/2006 | Chou |
| 8,355,465 B2 * | 1/2013 | Wojtiuk .................. 375/308 |
| 2002/0136326 A1 | 9/2002 | Underbrink et al. |
| 2003/0043950 A1 | 3/2003 | Hansen et al. |
| 2006/0098762 A1 | 5/2006 | Wojtiuk |

* cited by examiner

*Primary Examiner* — Lihong Yu
(74) *Attorney, Agent, or Firm* — Knobbe, Martens, Olson & Bear, LLP (57) ABSTRACT

A circuit for providing AM/PM modulation is described. The circuit includes a signal generator, which provides two phase modulated (PM) signals used to form two drive signals which are later combined in a constructive/destructive fashion. The combination of the two phase modulated signals form a signal for driving a load. When the load is driven, the resulting signal is AM/PM modulated.

20 Claims, 8 Drawing Sheets

DRIVER CIRCUIT FOR DRIVING A POWER AMPLIFIER

This application is a continuation of U.S. application Ser. No. 10/984,747 filed on Nov. 10, 2004 and titled "DRIVER CIRCUIT FOR DRIVING A POWER AMPLIFIER" the entirety of which is incorporated herein by reference to form a part of this specification.

BACKGROUND

The invention relates generally to transmission circuits and more particularly to a circuit for driving a power amplifier (PA).

One class of power amplifiers that is known to perform with high efficiency are those that operate in a saturation mode. Efficiency being defined as the ratio of power emitted, in the form of radio frequency signal, to the electrical power used by the amplifier in order to produce said radio frequency signal. In many communication systems using frequency modulation (e.g. FSK), amplifiers are operated at or near their most efficient point of operation since minimal amplitude variation in the output signal occurs. Unfortunately, as demand grows for increased transmitted data bandwidth within each transmission channel, amplitude modulation is introduced into transmitted signals. With both frequency and amplitude modulation, distortion impairing data transmission rates becomes a more important figure of merit in respect of power amplifier performance. First, varying the signal power causes efficiency variations with which a varying output power signal is amplified. Second, because there is amplitude modulation, any variation in the ratio between input amplitude and output amplitude of a P A results in distortion, known to create data transmission errors more likely. Furthermore, is can be appreciated that there are legislative requirements that govern how much signal power is allowed within adjacent transmission channels in a wireless communication system. Signal power in adjacent transmission channels can arise with increasing distortion applied to the original signal submitted for amplification.

It is desirable to produce an amplitude varying transmit signal in an efficient fashion thereby preserving power and, in the context of battery powered terminals, maximizing the time interval between terminal charging. Typically, most transmitter applications utilize linear amplifiers that are transmitting at a power level considerably reduced from the power level at which the amplifier saturates. This reduction is often called the back-off. For example, a PA might be designed and biased to supply 30 dBm of amplification at the point of gain compression (1 dB compression point) but is operated 6 dBm below that power level so that the power amplifier is a regime of operation where the gain is relatively invariant. Clearly, if the gain is invariant then distortion arising from amplitude modulation is minimized. While distortion performance is thereby improved, efficiency is compromised since the amplifier is still biased for operation at a much higher level of output power. Thus a need exists to amplify an amplitude-varying signal for transmission in a more efficient manner.

One known method of increasing the efficiency in such an amplifier is by increasing the control circuitry complexity to vary more amplifier parameters in order to maintain near optimal efficiency for any and all amplification requirements. The disadvantage of such a scheme is that if the control system for controlling the PA is too complicated then it might consume more power than it recovers through efficiency. Moreover, additional control circuitry will commensurately increase the size of circuit board or, in the context of monolithic integration, the semiconductor die area. It is also well appreciated by the semiconductor power amplifier designers that power amplifier control schemes can lead to problems with the stability of the amplifier. Often an amplifier using a control loop will oscillate at some frequencies. Generally speaking, control systems for controlling various operation parameters of the power amplifier will add cost and, as the complexity of the control circuit increases, the power savings diminish.

Another known approach utilizes a plurality of PAs driven in parallel wherein the phase of the input signal provided to each of the PAs is controlled. A power combiner is coupled to the output ports of each of the PAs to combine output signals therefrom using a vector sum. Under this scheme, amplitude modulation is provided by controlling the phase angle of the input. However, efficiency of such an amplifier is often impaired by losses in the combiner circuit and therefore output power is wasted even though in principle each PA is operated close to the saturated output power level.

In typical transmitter systems, transmitter signal generators generate a modulated signal at a known carrier frequency for transmission at a known power level using two separate circuits, a modulation circuit and a power amplifier circuit (PA). The modulation circuit is for generating of a modulated signal, or RF signal, and then the PA is used to amplify the modulated signal to the known power level. Typically it is the PA that consumes a majority of power for the signal generator and, as such, PA efficiency is of significant concern. The PA circuit is typically implemented using any of a number of different transistor manufacturing technologies, such as GaAs, Si bipolar, SiGe bipolar, LDMOS and CMOS FET. Though the CMOS FET technology enables implementation of reasonable nonlinear PA circuits, it has yet to demonstrate competitive efficiency when used for implementing of linear power amplifier circuits. The GaAs, SiGe and Si bipolar devices produce excellent linear PAs, but they are not always available as device options combined with a state-of-the-art CMOS process. Moreover, conventional CMOS technology remains one of the most cost effective semiconductor electronics technology platforms available today. It is available from a number of foundry suppliers, particularly to satisfy the market for digital CMOS circuits that' are extensively utilized in modem telecommunication and computing systems.

GaAs and other group III-V materials have yet to be integrated into a high density CMOS process so that a single chip solution incorporating both the signal processing elements, primarily digital in nature, and amplifying elements are not yet practical. Rather, one often finds systems implemented using a mix of semiconductor technology elements. Unfortunately, state of the art CMOS linear power amplifiers do not have high efficiency operation, primarily due to the CMOS transistor saturation voltage. This drawback, inherent to known architectural approaches for a linear amplifier, prevents linear CMOS PAs from being accepted in the market for many common RF applications because they result in significantly reduced battery life for portable devices.

On the other hand, a non-linear architecture using CMOS switch-class PAs, can operate with constant amplitude envelope signals quite efficiently for some applications. Unfortunately, CMOS transistors operating in a switched mode, do not have effective power control much less sufficient dynamic range in said power control for CDMA applications or other modulation scheme wherein amplitude control is an important part of the signal transmission scheme. One known way of achieving power control in the context of a switch class CMOS PA, is by reducing the drain to source terminal voltage (Vds) for the FET therein. This reduction in Vds can provide approximately 30 dB of power control. Unfortunately, it is known to those skilled-in-the-art that CDMA and WCDMA applications require in excess of 60 dB power control.

For efficient operation in transmitter circuits, polar transmitter circuits can be utilized, where the amplitude modulation is applied directly to the PA through collector/drain voltage control and or bias control. Primarily this approach relies on predictable amplitude and phase response through the PA over a wide range of output signal powers. Alternatively, this approach relies on amplitude and phase compensation circuits being used to compensate for imperfections. Unfortunately, it is well appreciated by those skilled-in-the-art that the known compensation circuits consume power and increase the cost of the transmitter. Furthermore, there is significant demand to integrate signal generator circuits into a single IC, which is difficult with the above architectures. For example, Polar transmitter circuits are generally not integrated within the PA because the amplifying transistors used within the PA are constructed in a different semiconductor or manufacturing platform than that which is used for the Polar transmitter circuit and associated compensation circuitry. Effectively, integration of both the signal conditioning circuitry, wherein the circuitry generates the modulation, and the power amplifier into one semiconductor technology platform compromises the overall circuit performance with the existing architectures described above. Such a compromise in performance is often not acceptable to the marketplace.

It is conceivable that a P A circuit could be integrated with the modulation circuit using a SiGe technology, but this has yet to be achieved in a market acceptable form and is considered difficult with CMOS devices. A need therefore exists to integrate the signal generator including the modulation circuit and the PA circuit in a single semiconductor die using a CMOS process. This allows for the benefit of advances in CMOS process technology and reduced costs due to high volume for CMOS wafers.

It is therefore an object of the invention to provide a relatively efficient and relatively linear CMOS power amplifier that can be integrated with a modulation circuit to form a complete integrated signal generator circuit.

SUMMARY

In accordance with the invention there is provided a method of generating a first drive signal and a second drive signal comprising: receiving phase modulation information; receiving amplitude modulation information; and, generating two phase modulated signals forming the two drive signals for being combined, a combination of the two phase modulated signals forming a signal for driving a load, the load when driven resulting in an AM/PM signal.

In accordance with an embodiment of the invention there is provided a method of generating two phase modulated signals comprising: generating a phase modulated carrier signal, the phase modulation relating to the received phase modulation; information; splitting the phase modulated carrier signal into a first PM signal and a second PM signal, the first and second PM signals approximately same in magnitude; and phase modulating each of the first and second PM signals with approximately opposite phase variations to result in the two drive signals.

In accordance with another aspect of the invention there is provided a circuit for generating a first drive signal and a second drive signal comprising: at least a first input port for receiving phase modulation information and amplitude modulation information; and, a signal generator for generating two phase modulated signals forming the first drive signals and the second drive signal for being combined, a combination of the two phase modulated signals forming a signal for driving a load, the load when driven resulting in an AM/PM signal.

In accordance with an embodiment of the invention there is provided a signal generator comprising: a first signal generator and phase modulating circuit for generating a phase modulated carrier signal, the phase modulation relating to the received phase modulation information; a second phase modulator for receiving the phase modulated carrier signal and for phase modulating same; and, a third phase modulator for receiving the phase modulated carrier signal and for phase modulating same with approximately opposite phase variations to those applied by the second phase modulator.

In accordance with another aspect of the invention there is provided a memory storage medium having data stored therein, the data for when executed resulting in an integrated circuit design comprising: at least a first input port for receiving phase modulation information and amplitude modulation information; and, a signal generator for generating two phase modulated signals forming the first drive signals and the second drive signal for being combined, a combination of the two phase modulated signals forming a signal for driving a load, the load when driven resulting in an AM/PM signal.

In accordance with an embodiment of the invention there is provided a signal generator comprising: a first signal generator and phase modulating circuit for generating a phase modulated carrier signal, the phase modulation relating to the received phase modulation information; a second phase modulator for receiving the phase modulated carrier signal and for phase modulating same; and, a third phase modulator for receiving the phase modulated carrier signal and for phase modulating same with approximately opposite phase variations to those applied by the second phase modulator.

Advantageously, the invention supports substantial digital circuit implementation of AM/PM modulation of a carrier signal and is well suited to miniaturization.

BRIEF DESCRIPTION OF THE DRAWINGS

Exemplary embodiments of the invention will now be described in conjunction with the following drawings, in which.

DETAILED DESCRIPTION

Figure 1:
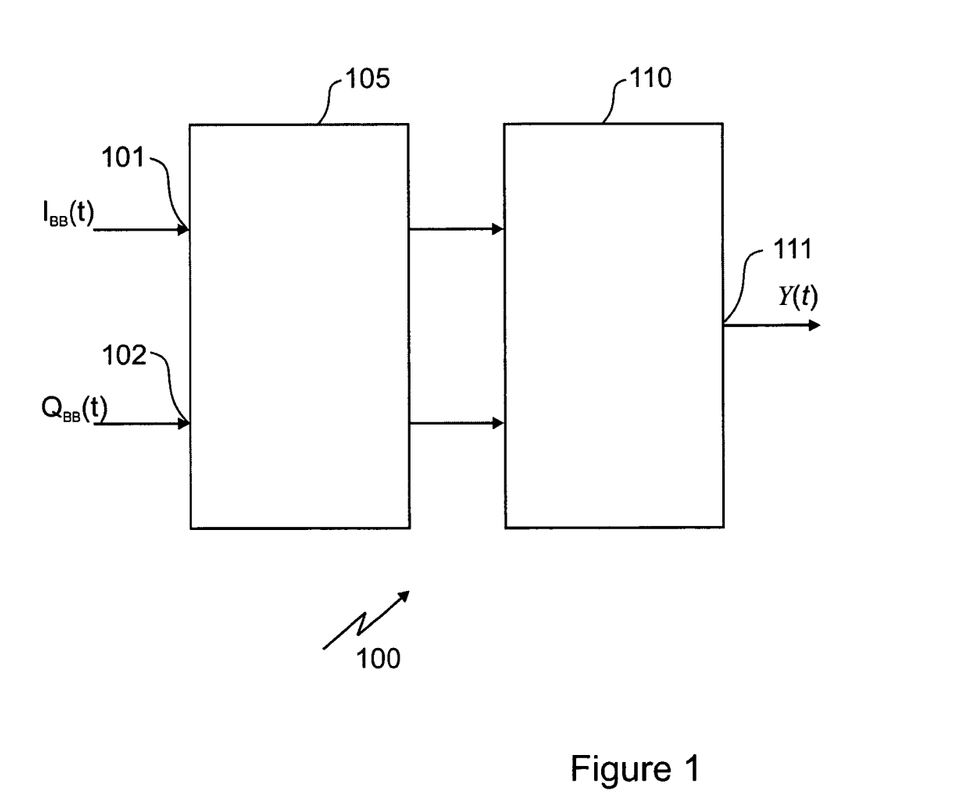
FIG. 1 illustrates a signal converter and combiner circuit.

Referring to FIG. 1, a signal converter and a combiner circuit 100 is shown. The circuit receives a first input signal $I_{BB}$ (t) at first input port 101 and a second input signal $Q_{BB}$ (t) at a second input port 102. The two signals are converted in signal converter 105 and provided to the combiner circuit 110. From the combiner circuit is provided an output drive signal yet) from output port 111. The present invention relates to the implementation and function of the signal converter for providing at least a signal for use in providing an amplitude and phase modulated (AMIPM) signal.

Figure 2:
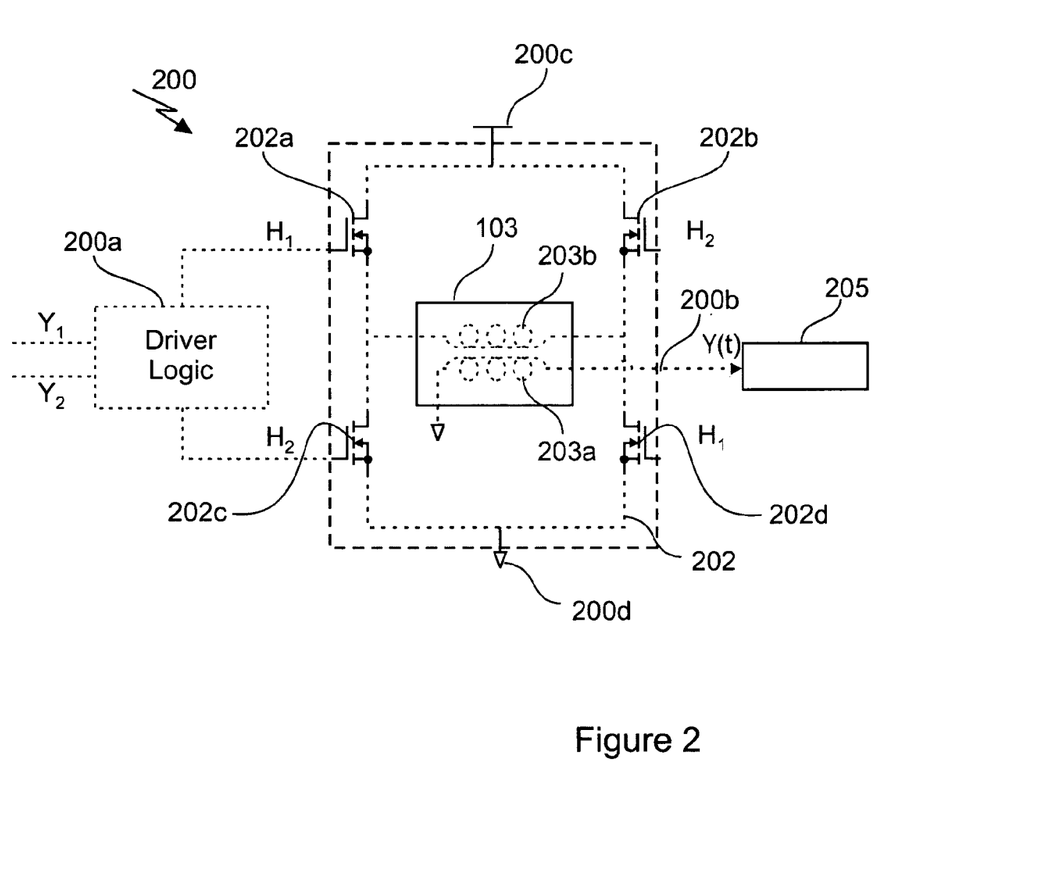
FIG. 2 illustrates a power amplifier (PA) output stage circuit in the form of a LINC PA and combiner circuit having an H-Bridge architecture.

FIG. 2 illustrates a power amplifier (PA) output stage 200 for receiving of two drive signals as provided by a signal converter according to the present invention. The output stage 200 is primarily in the form of an H-bridge 202 that is disposed between first and second supply voltage ports, 200c and 200d. The H-bridge circuit 202 is primarily formed from two circuit branches. A first circuit branch has a first end thereof coupled with the first supply voltage port 200c, where a first side of a first high side switching circuit 202a is coupled thereto. Coupled to the second side of the first high side switching circuit 202a is a first end of a primary winding 203b of a transformer 203. Coupled to the second end of the primary winding 203b is a second low side switching circuit 202d, which is further coupled with the second supply voltage port 200d, terminating the first circuit branch. A second circuit branch has a first end thereof coupled with the first supply voltage port 200c, where a first side of a second high side switching circuit 202b is coupled thereto. Coupled to the second side of the second high side switching circuit 202b is a second end of the primary winding 203b of the transformer 203. Coupled to the first end of the primary winding 203b is a first low side switching circuit 202c, which is further coupled with the second supply voltage port 200d, terminating the second circuit branch. Thus, the first and second circuit branches cross in the center of the H-bridge along the primary winding 203b. A secondary winding 203a for the transformer 203 is coupled with a load 205. In this case, the transformer 203 is absent a center tap.

A PA output stage input port 200a is coupled with the first high side switching circuit 202a and the second low side switching circuit 202d for controlling the switching operation thereof. The P A output stage input port 200a is coupled with the second high side switching circuit 202b and the first low side switching circuit 202c via a second port thereof for controlling the switching operation thereof. The H-bridge circuit therefore allows for controlling the polarity of the signals that propagate through the primary winding 203b of the transformer 203.

A power amplifier circuit is preferably connected to the output stage input port 200a for providing a signal thereto for producing a single-ended output to the load 205. Preferably the switching circuits, 202a through 202d, are in the form of MOS devices that are hard switched to reduce current losses. Further preferably, complementary devices are used to increase voltage swing at the output port 200b while reducing the voltage across each of the MOS devices. Driving a floating load 205 with a differential signal is a common technique for increasing the signal amplitude across the load 205. The transformer 203 converts the differential signal into a single ended signal for provision to the load 205.

Connecting the primary winding of the transformer across the power supply, through the use of the switching circuits 202a through 202d, and alternating the polarity of the connection, the current flow through the primary winding is limited by the inductance of the transformer, and the losses across the switching circuits, 202a through 202d, are reducible. This results in an efficient generation of a carrier signal suitable for constant-envelope signals. Further, the signal thereby produced has three possible potentials, neutral, positive or negative, depending on the signals HI and H2.

Figure 3:
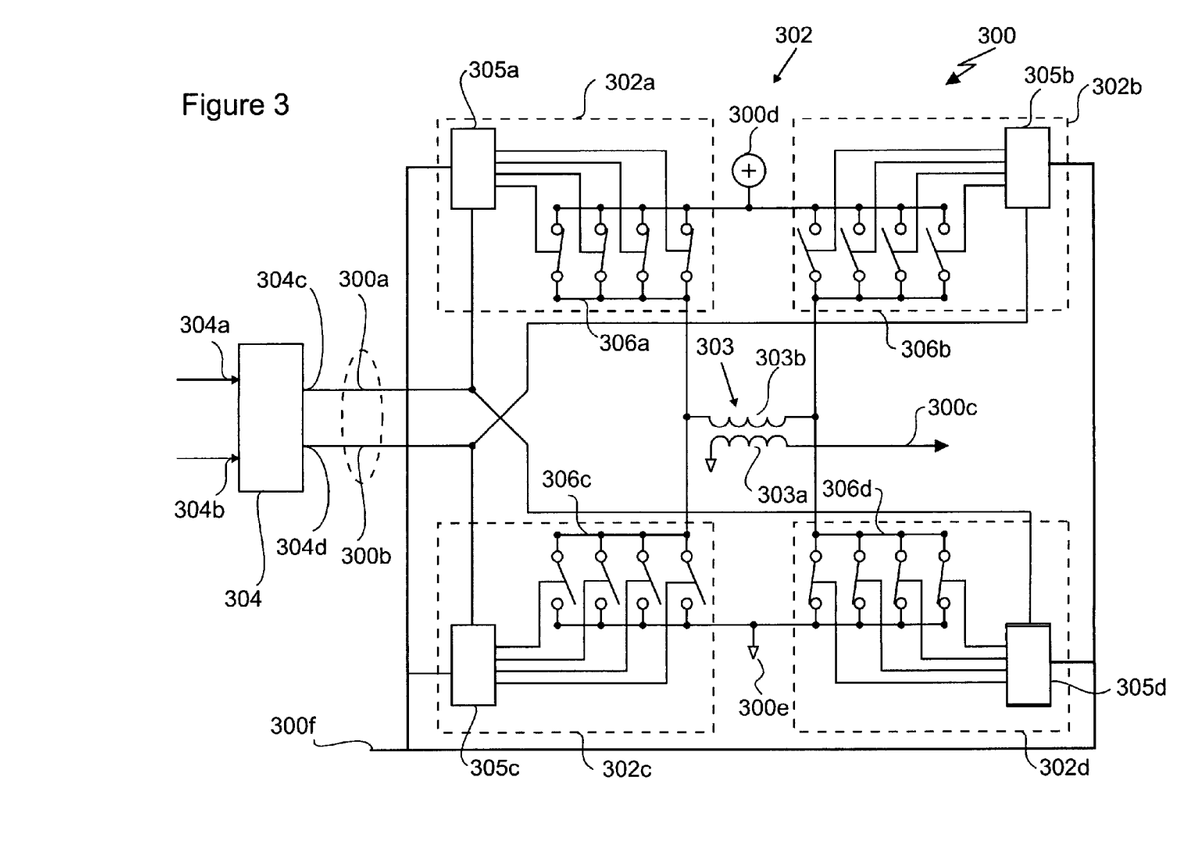
FIG. 3 illustrates a differential amplifier according to an embodiment of the invention.

FIG. 3 illustrates a differential amplifier 300 according to an embodiment of the invention for use in a signal generator circuit for generating a modulated signal at a known carrier frequency. An output stage 302 is provided in the form of a H-bridge that is disposed between first and second supply voltage ports, 300d and 300e. The H-bridge circuit 302 is formed from two circuit branches. A first circuit branches has a first end thereof coupled with the first supply voltage port 300d, where a first side of a first high side driver circuit 302a is coupled thereto. Coupled to the second side of the first high side driver circuit 302a is a first end of a primary winding 303b of a transformer 303. Coupled to the second end of the primary winding 303b is a second low side driver circuit 302d, which is further coupled with the second supply voltage port 300e, terminating the first circuit branch. A second circuit branch has a first end thereof coupled with the first supply voltage port 300d, where a first side of a second high side driver circuit 302b is coupled thereto. Coupled to the second side of the second high side driver circuit 302b is a second end of the primary winding 303b of a transformer 303. Coupled to the first end of the primary winding 303b is a first low side driver circuit 302c, which is further coupled with the second supply voltage port 300e, terminating the second circuit branch. Thus, the first and second circuit branches cross in the center of the H-bridge along the primary winding 303b. A secondary winding 303a of the transformer 303 is coupled with an external load (not shown) and used for providing of a high power modulated RF signal thereto.

The transmitter output stage 300 is provided with a first input port 300a and a second input port 300b. The first input port 300a is coupled with the first high side driver 302a and with the second low side driver 302d and the second input port 300b is coupled with the second high side driver 302b and the first low side driver 302c. Within each of the drivers, 302a through 302d, switching circuits, 306a through 306d, as well as power control circuits, in the form of switching circuits 305a through 305d, are disposed, respectively. Switching circuits 306a are disposed between the first supply voltage port 300d and the first end of the primary winding 303b. Switching circuits 306b are disposed between the first supply voltage port 300d and the second end of the primary winding 303b. Switching circuits 306c are disposed between the second supply voltage port 300e and the first end of the primary winding 303b and switching circuits 306d are disposed between the second supply voltage port 300e and the second end of the primary winding 303b. Signal path delays within the signal-processing block 304 are approximately the same for the generation of the first and second output signals.

Each of the switching circuits is comprised of an array of binary-scaled switches, where each switch from the array is disposed between a supply voltage port and one of the ends of the primary winding 303b. The power control circuit 305a, 305b, 305c and 305d, found in each high side driver, 302a and 302b, and low side driver, 302c and 302d, is coupled with a same control port for receiving a power control signal for controlling the switching operation of each of the binary-scaled switches. The power control signal is in the form of a digital power control signal and is provided through a power control port 300f that is coupled with each of the power control circuits, 305a through 305d. This digital power control signal is used for gating the first and second digital signals that are provided to the output stage 302. Each array of the binary-scaled switches thus controls the current level provided to the transformer 303 via one or more of the array of digitally selectable power flow paths. This gating determines the power level that is transmittable using the transmitter 300.

The binary scaling of the switches determines the current that each of switches from each array propagates, when closed. So for example, if there are four switches within each switching circuit, the switches are weighted in such a manner that the most significant bit enables opening and closing of the fourth switch and a least significant bit enables opening and closing of the first switch. When the fourth switch is closed it propagates eight times more current than the first switch, when closed. The third switch propagates four times more current than the first switch and the second switch propagates twice as much current as the first switch. The digital control signal is used for controlling each of the switches. For the four switches, a four bit digital value is used to control the operation thereof providing 16 switchably selectable different current levels. Of course, four switches is only an example and of course any number of switches are optionally implemented in order to meet the power requirements of the transmitter 300. Preferably each of the switches are MOS devices where an amount of current that each switch propagates when closed is determined by an area of the MOS device(s) that forms the switch. The power control circuits, 305a through 305d, are used to adjust the RF output signal power for transmission. Typically, this adjustment is performed at relatively slow and infrequent transitions, though it is feasible to use this for signal modulation. Potentially, when the power control circuits 305a through 305d are used for signal modulation, small amplitude steps result in additional amplitude modulation noise in the RF output signal. This additional noise can be compensated for either with pre-compensation or post-compensation based on a control circuit.

A signal processing circuit 304 is used for providing of first and second digital signals to the first and second output stage input ports 300a, 300b using first and second output ports, 304c and 304d, coupled thereto. First and second input ports, 304a and 304b, of the signal-processing block 304 are used for receiving of a carrier signal and a modulation signal from an external source (not shown). Alternatively, the input to the signal processing circuit consists of one port for receiving a signal that contains the information required for the signal processing circuit to generate at least an appropriate output signal. Within the signal-processing block 304, circuitry processes the carrier and modulation signals to form the first and second digital signals that are phase shifted relative to each other for controlling a conduction angle for the output stage 302. A relative phase between these first and second output signals determines the amplitude for the RF output signal and the absolute phase determines the phase modulation. The amplitude modulation is applied to the RF output signal by controlling the relative phasing of the first and second digital signals and thus generates smoother amplitude transitions, which results in a cleaner transmit spectrum.

Advantageously, the transmitter circuit 300 allows for controlling of the RF output signal power without adjusting the biasing of the signal generating circuit. Instead, amplitude and phase modulation is controlled by a pulse width modulator circuit that is controlled using time alignment circuits implemented in, for example, a digital technology. The resulting control signals are summed in a constructive/destructive fashion across the transformer to result in the pulse width modulated signal. This approach provides greater repeatability and reliability than the analog control techniques. Alternatively, amplitude modulation is controlled by both phase modulation and by varying the current levels through the transformer. Once the pulse width modulated signal is generated, it is optionally filtered using a filter circuit to produce an amplitude modulated signal at the known carrier frequency. Alternatively, filtering is a result of characteristics of a load in the form of a radiator for radiating the signal. Alternatively, the load is in the form of a cable for conducting the signal.

Signal processing within the signal processing circuit 304 is used to create the first digital signal and the second digital signal that are provided to the output stage 302. Optionally, switches within each array of binary-scaled switches are turned on and off in a predetermined manner in relation to time to create a predetermined power profile. The turn-on and turn-off profile of the switches is relates to the ramp on or the ramp off for the P A (terms used in cellular communication). Peak power at any time is determined by a number of switches that are turned on within each switch array and the amplitude modulation for the output stage is determined by the phasing between the first and second digital signals that are provided to the output stage 302.

The transmitter circuit 300 above enables the amplitude modulation of the output signal by using pulse width modulation, through the control of the phase of the first and second digital signals, where the output stage 302 combines the two digital signals without the need for an independent combiner circuit. Through the use of a plurality of switching circuits, which are individually switchably selectable, a segmented output architecture is provided that enables RF output signal power control through selecting a number of switching elements that are to be switched. Within the output stage 302 the digital signals are combined without the use of a separate power combiner. Optionally, an attenuator circuit is used in conjunction with the smallest current switching circuit to extend the power control range for the transmitter 300. Further optionally, the output signal power control is also used for amplitude modulation along with the pulse width modulation in order to extend the range over which amplitude modulation is reversibly encoded within the signal.

In an alternative embodiment, data provided to the transmitter 300 includes data relating to a RF frequency to be transmitted, the phase information for the modulated signal, and amplitude information for the signal to be generated, which is to be decomposed into 'modulation' and the desired RF level, and/or data that describes the modulation scheme and data to be transmitted.

Figure 4A:
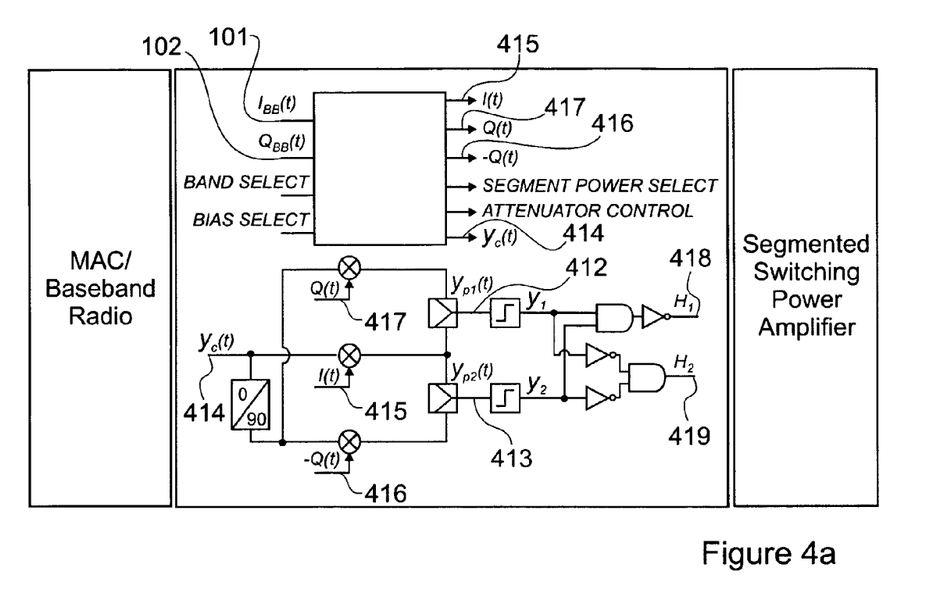
FIG. 4a illustrates an embodiment of the signal processing block of FIG. 3.
Figure 4B:
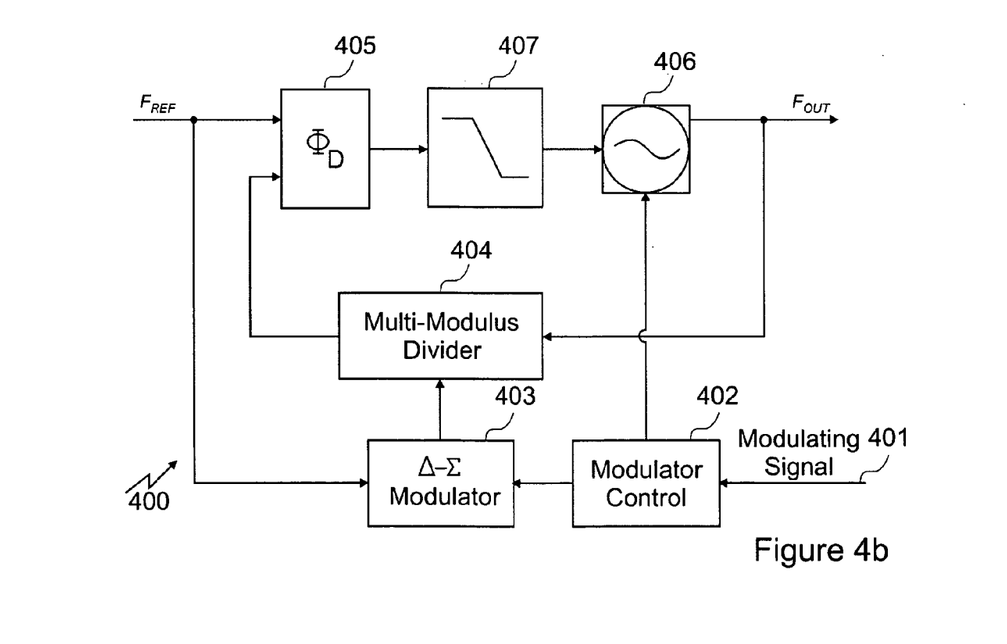
FIG. 4b illustrates a delta-sigma based fractional-N frequency synthesizer with two-point delta-sigma modulation according to the invention.

Referring to FIG. 4a, shown is the contents of a signal processor block according to the invention. The phase modulated carrier $y_c(t)$ 414 has been synthesized by the two-point delta-sigma based fractional-N frequency synthesizer as shown in FIG. 4b. The signal $y_c(t)$ 414 is then mixed with the signal I(t) 415 and the same signal 414 with a 90 degree phase adjustment is also mixed with the signal Q(t) 417 and −Q(t) 416 respectively using three mixers to apply amplitude modulation. The resulting signals are combined in accordance with the combiner shown for resulting in the first and second digital signals HI 418 and H2 419. The signals $I_{BB}(t)$ 101 and $Q_{BB}(t)$ 102 are used to determine I(t) 415, Q(t) 417 and the amplification switching to support numerous power levels of the switching power amplifier.

FIG. 4b illustrates a delta-sigma based fractional-N frequency synthesizer with two-point delta-sigma modulation 400, in accordance with another embodiment of the invention. The modulating signal information 401 is provided to the circuit and phase modulation is performed to provide a phase modulated carrier signal from a baseband signal. The frequency synthesizer is comprised of the following blocks: a modulator control 402, a delta-sigma modulator 403, a multi-modulus divider 404, a phase detector 405, a voltage controlled oscillator (VCO) 406 and a filter 407. The implementation is based on a phase-locked loop (PLL) using a multi-modulus divider 404 driven by a delta-sigma modulator 403 to provide frequency selection and modulation control. The baseband signal 401 is applied to the input port of the modulator control block 402, which sets the amount of modulation, provides an output signal to the voltage-controlled oscillator 406 and to the delta-sigma modulator 403. The data is passed through the delta sigma modulator 403, which quantizes the data and moves the quantization noise to a high frequency. The phase modulation is applied within the loop bandwidth through the delta-sigma modulator 403 and outside the loop bandwidth by directly tuning the VCO 406. This operation allows for wider loop bandwidths and improved transient and settling performance for burst mode operation while the delta-sigma modulator 403 compensates for some of the dynamic range and discrete spurious problems of the standalone fractional-N synthesizer.

Figure 5A:
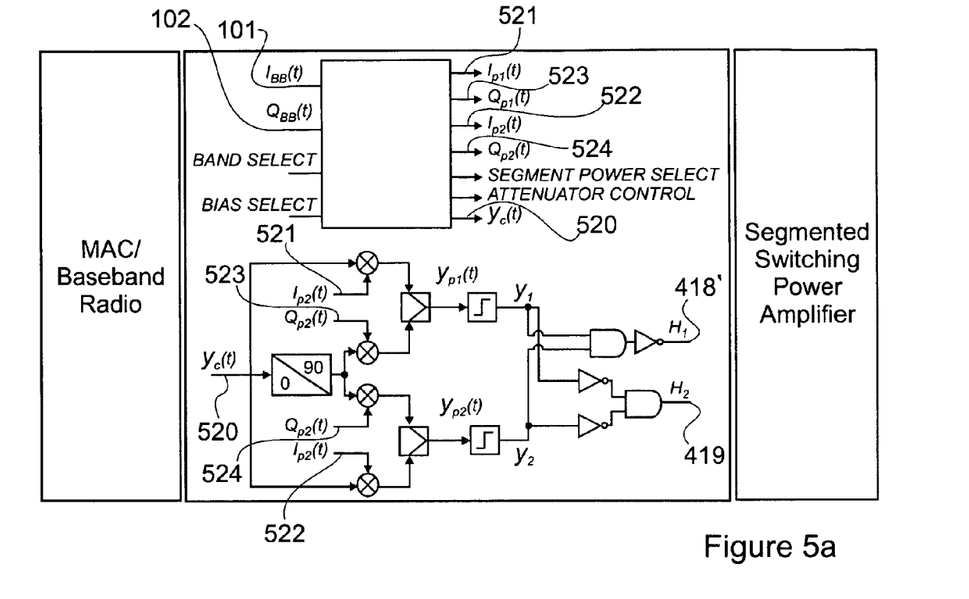
FIG. 5a illustrates another embodiment of the signal processing block of FIG. 3.
Figure 5B:
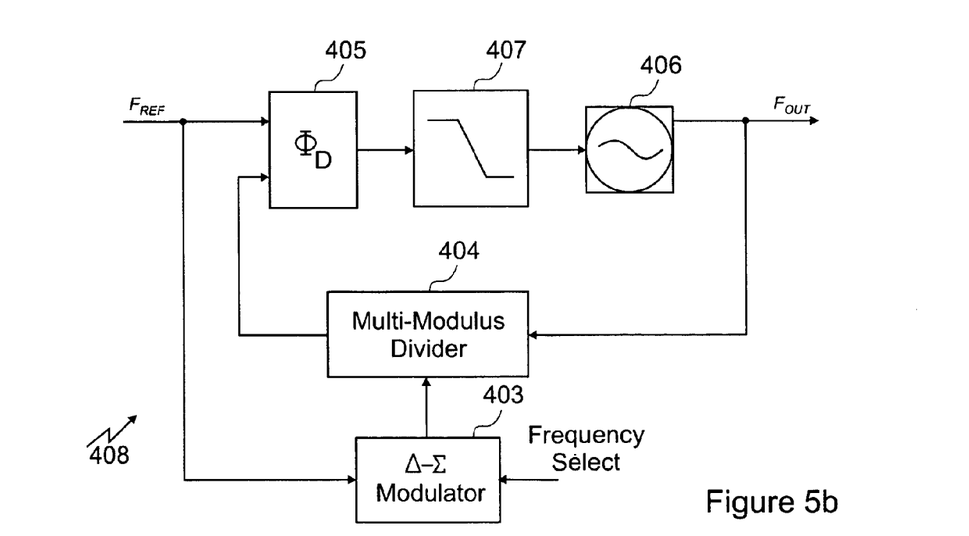
FIG. 5b illustrates a delta-sigma based fractional-N frequency synthesizer according to the invention.

As per another embodiment of the invention, FIG. 5a, shows the contents of a signal processor block according to another embodiment of the invention. The unmodulated carrier signal $y_c(t)$ 520 is synthesized by the delta-sigma based fractional-N frequency synthesizer as shown in FIG. 5b. The signal $y_c(t)$ 520 is then mixed with the signal $I_{p1}(t)$ 521 and $I_{p2}(t)$ 522 and the signal 520 is mixed 90 degrees out of phase with the signal $Q_{p1}(t)$ 523 and $Q_{p2}(t)$ 524 respectively using four mixers to apply phase and amplitude modulation. The resulting signals are combined in accordance with the combiner shown for resulting in the first and second digital signals H1 418 and H2 419. The signals $I_{BB}(t)$ 101 and $Q_{BB}(t)$ 102 are used to determine $I_{p1}(t)$ 521, $I_{p2}(t)$ 522, $Q_{p1}(t)$ 523, $Q_{p2}(t)$ 524 and the amplification switching to support numerous power levels of the switching power amplifier. The signal is mixed with I(t) and Q(t) using four mixers to impose both the phase and amplitude modulation As per the same embodiment of the invention, FIG. 5b illustrates a delta sigma based fractional-N frequency synthesizer 408, in accordance with this invention. The frequency synthesizer is comprised of the following blocks: a delta-sigma modulator 403, a multi-modulus divider 404, a phase detector 405, a voltage controlled oscillator (VCO) 406 and a filter 407. The frequency select signal 49 is input to the delta-sigma modulator 403, which quantizes the data and moves the quantization noise to a high frequency. The delta-sigma modulator 403 compensates for some of the dynamic range and discrete spurious problems of the stand-alone fractional-N synthesizer. The output of the delta-sigma based fractional-N frequency synthesizer 408, $F_{out}$ is taken as unmodulated carrier signal $y_c(t)$ 520 wherein the unmodulated carrier signal $y_c(t)$ 520 has been synthesized by the single-point delta-sigma based fractional-N synthesizer 408 as shown in FIG. 5b.

Figure 6:
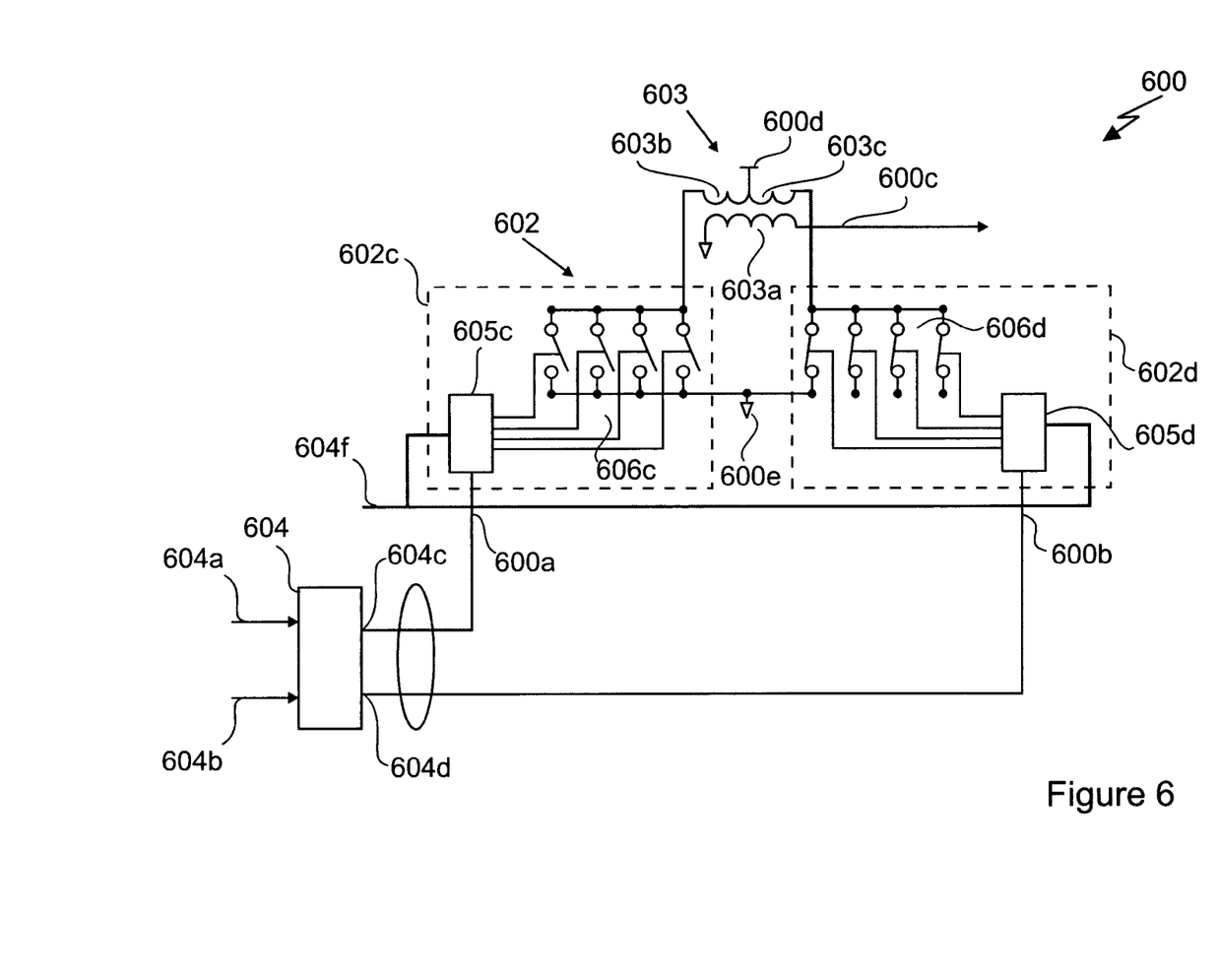
FIG. 6 illustrates a differential amplifier architecture, in the form of a transmitter, in accordance with another embodiment of the invention.

FIG. 6 illustrates a differential amplifier architecture 600, in the form of a transmitter, in accordance with another embodiment of the invention. An output stage 602 is provided in the form of a half H-bridge circuit that is disposed between first and second supply voltage ports, 600d and 600e. The half H-bridge circuit 602 is formed from two circuit branches. A first circuit branches has a first end thereof starting at a center tap 603c of a primary winding 603b of a transformer 603. A first end of the primary winding 603b is coupled with a first side of a first low side driver circuit 602c with a second side thereof further coupled with the second supply voltage port 600e, terminating the first circuit branch. A second circuit branch has a first end thereof starting at the center tap 603c of the primary winding 603b of a transformer 603. A second end of the primary winding 603b, opposite the first end of the primary winding, is coupled with a first side of a second low side driver circuit 602d with a second side thereof further coupled with the second supply voltage port 600e, terminating the second circuit branch. A secondary winding 603a of the transformer 603 is coupled with an external load (not shown) and used for providing of a high power modulated RF signal thereto.

The output stage 602 is provided with a first input port 600a and a second input port 600b. The first input port 600a is coupled with the first low side driver 602c and with the second low side driver 602d and the second input port is coupled with the second low side driver 602. Within each of the drivers, 602c and 602d, arrays of switching circuits, 606c and 606d, as well as power control circuits, 605c and 605d, are respectively disposed. The array of switching circuits 606c is thus disposed between a first portion of the primary winding 603b and the second supply voltage port 600e. The array of switching circuits 606d is thus disposed between a second portion of the primary winding 603b and the second supply voltage port 600e.

Each of the array of switching circuits, 606c and 606d, is comprised of an array of binary-scaled switches. The power control circuit 605c and 605d, found in each low side driver, 602c and 602d is coupled with a same control port for receiving a power control signal for controlling the switching operation of each of the binary-scaled switches. The power control signal is in the form of a digital power control signal and is provided through a power control port 604f coupled with each of the power control circuits, 605c and 605d. The digital power control signal is used for gating the first and second digital signals provided to the output stage 602. Each array of the binary-scaled switches controls the current level provided to the primary winding 603b of the transformer 603 via one or more of the array of digitally selectable power flow paths. The gating, for a setting of the binary-scaled switches, determines the maximum power level that is transmittable using the transmitter 600 at a current instance. Optionally, the binary-scaled switches are similar to those described with reference to the first embodiment of the invention.

A signal processing circuit 604 is used for providing of first and second digital signals to the first and second output stage input ports 600a, 600b via first and second output ports, 604c and 604d, coupled thereto. The digital signals provided to the first and second output stage input ports 600a, 600b are similar to those digital signals provided from the signal-processing block 604.

In order to provide signals to an amplifier architecture such as that shown in FIG. 3, a proposed polar signal processing block is described herein for driving the power amplifier. For this amplifier the modulation is represented differently to the more usual AM/PM polar or I/Q components. The signal processing block provides required signal conversion and is covered in more detail in below. The PA topologies considered here are broadly based around the well known linear amplification using nonlinear components (LINC) technique, where the outputs of two or more nonlinear amplifiers are combined to form the desired modulated carrier signal. The PA input signal is first decomposed into two or more phase modulated carriers that contain the original AM/PM content, allowing high PAE, non linear amplifiers to be used because the input signals have a near unity peak: to average power ratio. The PAE performance is preserved at lower output power levels through the additional use of segmentation.

Each PA is composed of a number of parallel transistors, or segments, each scaled for operation at a particular power level increment. The signal processing block provides the control signals necessary to select the appropriate transistor for a given power level.

Whilst the LINC technique may be applied to a wide range of nonlinear PA classes, the main focus of the signal processing block will be to leverage the recent advances in CMOS technology—particularly CMOS line width and current drive which impact die size and cost. Therefore the signal processing block and the PA is preferably designed for implementation in CMOS. Modern cellular/WLAN/WPAN multimode radios will likely benefit by using high-density, advanced CMOS technology to leverage the computing power (MIPS) and lower the die size. Advanced CMOS allows for faster digital signal processing at lower levels of power consumption, and having an all CMOS signal processing/PA design provides for a clearer path future integration with multimode CMOS radio vendors and partners.

The CMOS PA in the embodiments of the invention presented herein use the CMOS transistor as an amplifier to be operated as a "switch". The classes of PA that are biased to operate this way are well known to offer the highest theoretical efficiencies.

The input signals provided to the signal processor block are typically standard signal and control output signals, including but not limited to phase modulated carrier, AM envelope and ramp signal, band select, and bias control. Of course, other input signals are also supported as long as they contain sufficient information for generating the AM/PM output signal. The signal processing block generates the corresponding modulated driver signals and power level and ramp control signals to be applied to, for example, the segmented switching PA.

Generating Modulated PA Driver Signals

The general representation of a modulated carrier signal is of the form:

$$y(t) = \text{Re}\{c(t)e^{j\omega_c t}\} \quad (1)$$

where the complex modulating signal, represented in its I/Q and polar forms: $c(t) = I_{BB}(t) + jQ_{BB}(t) = |c(t)|\arg[c(t)] = A(t)e^{j\phi(t)}$, has a bandwidth much less than the carrier frequency $\omega_c$. The constant envelope phase modulated carrier signal generated using the Fractional-N frequency synthesizer with two-point modulation shown in FIG. 4b is of the form:

$$y_c(t) = \text{Re}\{e^{j\phi(t)}e^{j\omega_c t}\} \quad (2)$$

and the amplitude envelope signal derived from the baseband signal:

$$y_a(t) = A(t) \quad (3a)$$

Equations (2) and (3a) are used to generate:

$$y(t) = y_a(t)y_c(t) \quad (3b)$$

In the case of a burst mode transmitter it is assumed that this also contains the amplitude of the power up/down ramp as well as the amplitude content of the burst. The modulated carrier signal may be decomposed into two constant envelope phase modulated signals:

$$y(t) = y_{p1}(t) + y_{p2}(t) \quad (4)$$
$$= \text{Re}\{e^{j[\phi(t)+\alpha(t)]}e^{j\omega_c t}\} + \text{Re}\{e^{j[\phi(t)-\alpha(t)]}e^{j\omega_c t}\}$$

where the amplitude modulation content is contained in $$\alpha(t) = \arccos[A(t)/2)] \quad (5)$$

The carrier signals, $y_{p1}(t)$, and $y_{p2}(t)$, are in the correct format to drive some types of LINC PA's. However to drive the amplifiers as a switch they must be converted to binary level signals. Therefore $y_{p1}(t)$ and $y_{p2}(t)$ are first hard limited to form two phase modulated binary level signals $Y_1$; and $Y_2$. These signals are in the correct form to drive a LINC amplifier of the form shown in FIG. 2 although they need to both pass through a logical inverter to account for the switch also behaving as an inverter.

The signal processing block realizes the signals using the phase rotation properties of a vector modulator to modulate the amplitude information contained in the complex phasors $e^{\pm j\alpha(t)}$ onto the phase modulated carrier $y_c(t)$:

$$y_{p1}(t) = \text{Re}\{e^{j\{\alpha(t)\}}e^{j\omega_c t+\phi(t)}\} \quad (5)$$
$$= \text{Re}\{[\cos\{\arccos|c(t)|/2\} + j\sin\{\arccos|c(t)|/2\}]e^{j\omega_c t+\phi(t)}\}$$
$$= \text{Re}\{1/2[|c(t)| + j\sqrt{4-|c(t)|^2}]e^{j\omega_c t+\phi(t)}\}$$
$$= \text{Re}\{[I(t) + jQ(t)]e^{j\omega_c t+\phi(t)}\}$$

and similarly:

$$y_{p2}(t) = \text{Re}\{[I(t)-jQ(t)]e^{j\omega_c t+\phi(t)}\} \quad (6)$$

The above equations show that the two vector modulation operations are combinable by using the same in-phase signal and by noting that the two quadrature signals are related by a factor of −1. Also, the in phase signal is directly related to the amplitude modulation envelope. The signal processing block diagram architecture is shown in FIG. 4a.

In another embodiment of the invention, an unmodulated carrier signal is generated using a delta-sigma based fractional-N frequency synthesizer as shown in FIG. 5b. Wherein the carrier signal relating to the present embodiment of the invention is:

$$y_c(t) = \text{Re}\{e^{j\omega_c t}\} \quad (7)$$

In the present embodiment of the invention, the signal processing block in FIG. 5a realizes the signals using the phase rotation properties of a vector modulator to modulate the amplitude information contained in the complex phasors $e^{j\phi(t)\pm j\alpha(t)}$ onto the above unmodulated carrier $y_c(t)$:

$$y_{p1}(t) = \text{Re}\{e^{j\phi(t)+\alpha(t)}e^{j\omega_c t}\} \quad (8)$$
$$= \text{Re}\{[I_{p1}(t) + jQ_{p1}(t)]e^{j\omega_c t}\}$$
$$y_{p2}(t) = \text{Re}\{e^{j\phi(t)-\alpha(t)}e^{j\omega_c t}\} \quad (9)$$
$$= \text{Re}\{[I_{p2}(t) + jQ_{p2}(t)]e^{j\omega_c t}\}$$

Power Level and Ramp Control of the Segmented PA

The signal processor provides power control signals to the P A for setting the transmit power level and for power ramp on/off. The processor ensures that the PA output power versus time characteristic has the desired ramp shape so as to not violate any relevant switching transient and spectral mask requirements as determined by standards organizations and regulatory bodies. Additionally the signal processor ensures that the PA is adequately disabled so that output power is sufficiently blanked between bursts.

Optionally, most of the P A power is controlled in a discrete fashion by enabling the various segments. This method of power control by itself is likely to be insufficient due to the likely coarse quantization of the transistor segments in setting output power. This is particularly true for transferring the desired power ramp on/off characteristic. Optionally, the signal processing block also controls the attenuator within the PA and provides control of the modulated signal phasors—adjusting a—if necessary to provide a more continuous power control as required.

Signal Processing for Predistortion Correction

The signal processing block is also able to supply a predistortion correction of the AM transfer characteristic of the PA. A correction of the PM component is optionally accommodated with some modification to the vector modulator architecture.

Figure 7:
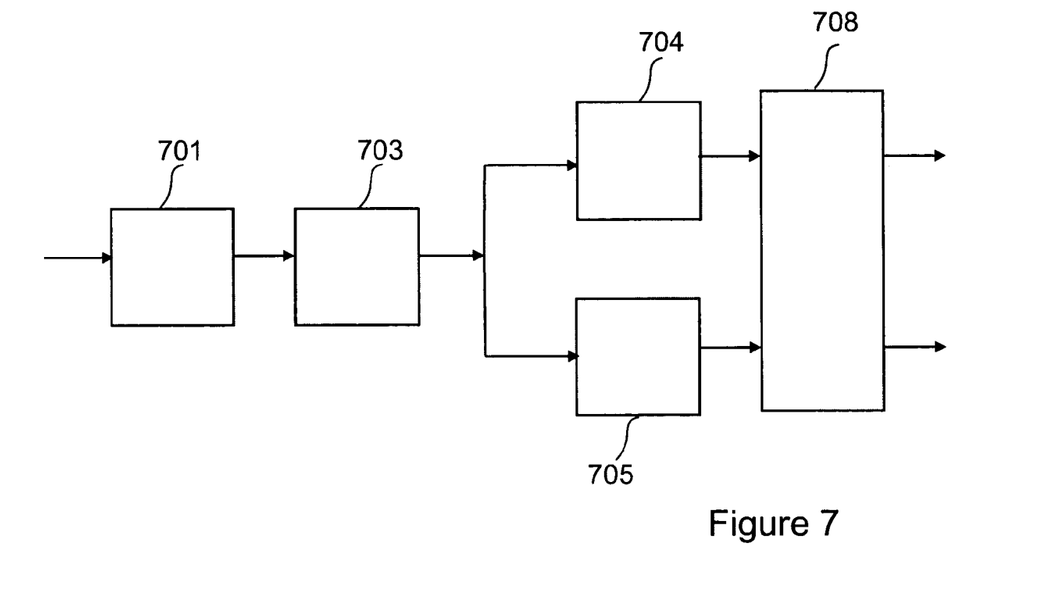
FIG. 7 illustrates a high level block diagram of a circuit architecture according to the invention.

Referring to FIG. 7, shown is a high level block diagram of a circuit architecture according to the invention. Here at least a signal is received at block 701 including phase modulation, amplitude modulation, and carrier frequency information. A carrier signal is generated at block 701. The carrier signal is modulated according to the phase modulation information in block 703. The phase modulated carrier signal is provided to each of two blocks, 704 and 705. In each of these blocks, the phase modulated carrier signal is further phase modulated according to the amplitude modulation information with a different polarity to the further phase modulation. The resulting two phase modulated signals are digitized at block 708 to provide two digital drive signals. Alternatively, the resulting two phase modulated signals are digital signals obviating a need for block 708.

Figure 8:
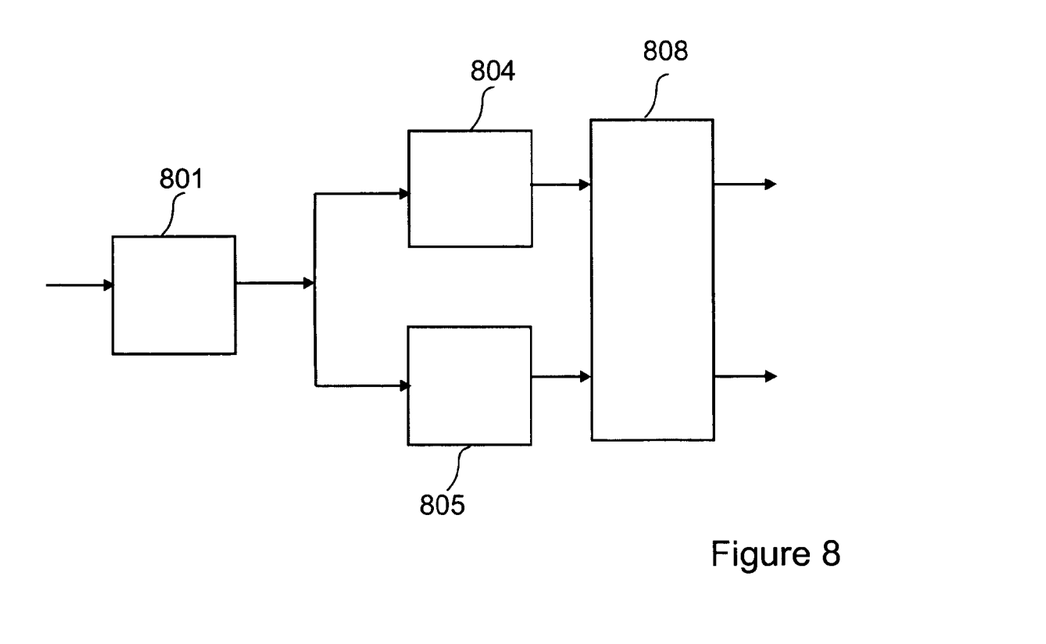
FIG. 8 illustrates a high level block diagram of another circuit architecture according to the invention.

Referring to FIG. 8, shown is a high level block diagram of another circuit architecture according to the invention. Here at least a signal is received at block 801 including phase modulation, amplitude modulation, and carrier frequency information. A phase modulated carrier signal is generated at block 801. The phase modulated carrier signal is provided to each of two blocks, 804 and 805. In each of these blocks, the phase modulated carrier signal is further phase modulated according to the amplitude modulation information with a different polarity to the further phase modulation. The resulting two phase modulated signals are digitized at block 808 to provide two digital drive signals. Alternatively, the resulting two phase modulated signals are digital signals obviating a need for block 808.

Figure 9:
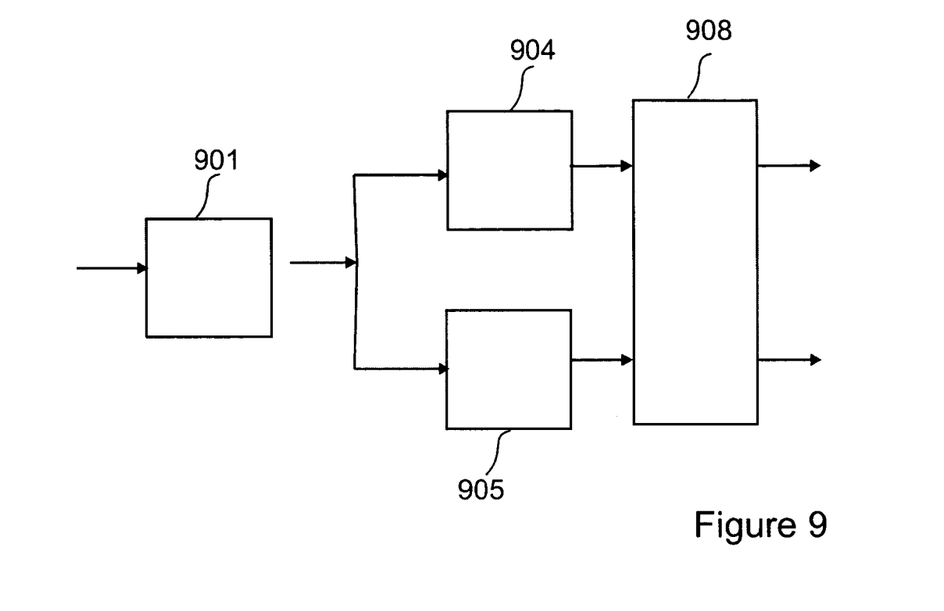
FIG. 9 illustrates a high level block diagram of a circuit architecture according to the invention; and, FIG. 10 illustrates a high level block diagram of a circuit architecture according to the invention.
Figure 10:
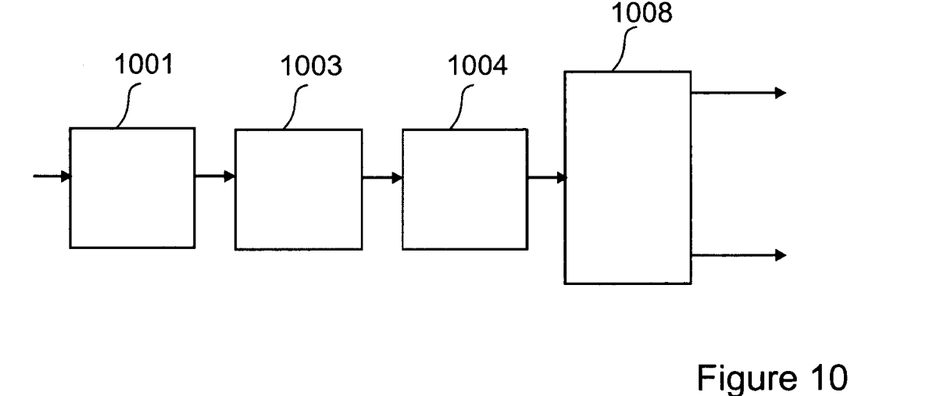

In the embodiments of FIGS. 7 and 8, three phase modulators are employed to achieve phase and amplitude modulation. In FIGS. 9 and 10 below, only two phase modulators are necessary to achieve the same outcome.

Referring to FIG. 9, shown is a high level block diagram of a circuit architecture according to the invention. Here at least a signal is received at block 901 including phase modulation, amplitude modulation, and carrier frequency information. A carrier signal is generated at block 901 and provided to each of two blocks, 904 and 905. In each of these blocks, the carrier signal is phase modulated according to the phase modulation information and according to the amplitude modulation information with a different polarity to the amplitude modulation related phase modulation. The resulting two phase modulated signals are digitized at block 908 to provide two digital drive signals. Alternatively, the resulting two phase modulated signals are digital signals obviating a need for block 908.

Referring to FIG. 10, shown is a high level block diagram of a circuit architecture according to the invention. Here at least a signal is received at block 1001 including phase modulation, amplitude modulation, and carrier frequency information. A carrier signal is generated at block 1001. The carrier signal is modulated according to the phase modulation information in block 1003 and according to the amplitude modulation information. The phase modulated carrier signal is provided to a second phase modulator 1004 where it is further phase modulated according to twice the amplitude modulation information with a different polarity to the further phase modulation. The resulting phase modulated signal and further phase modulated signal are digitized at block 1008 to provide two digital drive signals. Alternatively, the resulting two phase modulated signals are digital signals obviating a need for block 1008.

Though FIGS. 9 and 10 refer to a separate step of carrier signal generation and phase modulation, it is also achievable using a single phase modulated carrier signal generation step as described hereinabove.

Further, compensation for ramp on/ramp off characteristics of the circuit and load are easily implemented according to the inventive embodiments since those characteristics affect edge timing which effectively affects phase. Since all modulation is being achieved via phase modulation, adjusting the phase modulation to compensate for ramp on/ramp off effects is relatively straightforward. For example, if the ramp on results in a delay, d1, and the ramp off results in a delay, d2, the resulting phase modulation is easily calculated to retain the pulse center at the correct phase related location within the signal and to maintain the pulse edges spaced apart for resulting in the amplitude modulation desired. As such, compensation for these effects is relatively straightforward. Also, since the circuit operates in a near digital fashion, concerns relating to rise and fall times for signal pulses having different amplitudes are also obviated.

The above noted architecture lends itself very well to small geometry CMOS integration. All of the high speed logic functions are very simple whilst the most computationally intensive digital signal processing operations are performed on baseband signals within the modulation bandwidth.

The present architecture allows a good balance of analogue/digital signal processing when implemented. Alternatively, the design is enabled in a more discrete form for demonstration platforms, and perhaps to interface to higher power PA's for base station applications.

Of course, though the above embodiments are described with reference to the H-bridge amplifier topology, the methodology applies to other amplifier topologies as well. This is apparent to those of skill in the art.

Though the embodiments described above each relate to phase and amplitude modulation within an AM/PM circuit, the invention is also applicable to amplitude modulation in isolation. Further, the invention is applicable to phase modulation in isolation. Further advantageously, the invention is applicable when phase modulation is already performed and wherein amplitude modulation is to be superimposed thereon.

Numerous other embodiments may be envisaged without departing from the spirit or scope of the invention.

What is claimed is:

1. A method of generating a first drive signal and a second drive signal to provide a modulated radio frequency (RF) signal, the method comprising:
   receiving at least phase modulation (PM) information and amplitude modulation (AM) information;
   generating an unmodulated carrier signal;
   phase modulating the unmodulated carrier signal according to the phase modulation information and the amplitude modulation information with a first phase variation to provide a first drive signal; and
   phase modulating the unmodulated carrier signal according to the phase modulation information and the amplitude modulation information with a second phase variation to provide a second drive signal, the first and second phase variations being different, a difference in phase between the first and second drive signals associated with the amplitude modulation information, a load being driven with the first and second drive signals resulting in a modulated RF signal being phase modulated according to the phase modulation information and amplitude modulated according to the amplitude modulation information.

2. The method of claim 1 wherein the first and second phase variations are approximately opposite phase variations.

3. The method of claim 1 wherein the first and second drive signals are phase shifted relative to each other to control a conduction angle for an amplifier.

4. The method of claim 1 further comprising forming a first constant envelope phase modulated signal by modulating the amplitude modulation information with the first phase variation onto the unmodulated carrier signal and forming a second constant envelope phase modulated signal by modulating the amplitude modulation information with the second phase variation onto the unmodulated carrier signal.

5. The method of claim 4 further comprising converting the first constant envelope phase modulated signal into a first digital drive signal and converting the second constant envelope phase modulated signal into a second digital drive signal, the first and second digital drive signals being phase modulated binary level signals.

6. The method of claim 5 further comprising combining the first and second digital drive signals to form a drive signal for driving a load.

7. The method of claim 6 further comprising driving a load with the drive signal to provide the modulated RF signal.

8. The method of claim 6 wherein a pulse center of the drive signal is associated with the phase modulation information and a pulse width of the drive signal is associated with the amplitude modulation information.

9. The method of claim 1 further comprising receiving a frequency select signal, the unmodulated carrier signal based at least in part on the frequency select signal.

10. The method of claim 1 wherein an average of the difference in phase between the first and second drive signals is associated with the phase modulation information and an absolute phase difference between the first and second drive signals is associated with the amplitude modulation information.

11. A circuit for generating a first drive signal and a second drive signal to provide a modulated radio frequency (RF) signal, the circuit comprising:
an input port configured to receive at least phase modulation (PM) information and amplitude modulation (AM) information;
a frequency synthesizer configured to generate an unmodulated carrier signal;
a first phase modulating circuit configured to receive the unmodulated carrier signal and to modulate the unmodulated carrier signal according to the phase modulation information and the amplitude modulation information to provide the first drive signal; and
a second phase modulating circuit configured to receive the unmodulated carrier signal and to modulate the unmodulated carrier signal according to the phase modulation information and the amplitude modulation information with different phase variations than those applied by the first phase modulating circuit to provide the second drive signal, a difference in phase between the first and second drive signals associated with the amplitude modulation information so that driving a load with the first and second drive signals results in an AM/PM radio frequency signal being phase modulated according to the phase modulation information and amplitude modulated according to the amplitude modulation information.

12. The circuit of claim 11 wherein the different phase variations are approximately opposite phase variations.

13. The circuit of claim 11 wherein the different phase variations applied by the second phase modulating circuit are approximately 90° out of phase with the phase variations applied by the first phase modulating circuit signal.

14. The circuit of claim 11 wherein the phase modulation information and the amplitude modulation information include I/Q baseband information.

15. The circuit of claim 11 wherein the frequency synthesizer includes a single point delta-sigma based fractional-N synthesizer configured to generate the carrier signal based at least in part on a frequency select signal.

16. The circuit of claim 11 wherein the first phase modulating circuit is configured to form a first constant envelope phase modulated signal by modulating the amplitude modulation information onto the unmodulated carrier signal and the second phase modulating circuit is configured to form a second constant envelope phase modulated signal by modulating the amplitude modulation information onto the unmodulated carrier signal.

17. The circuit of claim 16 further comprising a digital converter configured to convert the first constant envelope phase modulated signal into a first digital drive signal and the second constant envelope phase modulated signal into a second digital drive signal, the first and second digital drive signals being phase modulated binary level signals.

18. The circuit of claim 17 further comprising an H-bridge combining circuit configured to combine the first and second digital drive signals to form a drive signal for driving a load to provide the AM/PM radio frequency signal.

19. The circuit of claim 18 further comprising an RF amplifier configured to amplify the drive signal.

20. The circuit of claim 19 being integrated in a single semiconductor die using a CMOS process.

* * * * *

UNITED STATES PATENT AND TRADEMARK OFFICE
CERTIFICATE OF CORRECTION

PATENT NO. : 8,588,338 B2
APPLICATION NO. : 13/733380
DATED : November 19, 2013
INVENTOR(S) : Wojtiuk It is certified that error appears in the above-identified patent and that said Letters Patent is hereby corrected as shown below:

In the Specification

In column 3 at line 7, Change "and or" to --and/or--.

In column 12 at line 21, Change "$= \text{Re}\{[/(t) + jQ(t)]e^{j\omega ct + \varphi(t)}\}$" to --$= \text{Re}\{[I(t) + jQ(t)]e^{j\omega ct + \varphi(t)}\}$--.

In the Claims

In column 16 at line 23, In Claim 13, Change "circuit signal." to --circuit.--.

Signed and Sealed this
Third Day of June, 2014

Michelle K. Lee
*Deputy Director of the United States Patent and Trademark Office*